(12) United States Patent
Sugimachi et al.

(10) Patent No.: US 11,322,432 B2
(45) Date of Patent: May 3, 2022

(54) SEMICONDUCTOR MODULE AND POWER CONVERSION APPARATUS

(71) Applicant: Mitsubishi Electric Corporation, Tokyo (JP)

(72) Inventors: Seiya Sugimachi, Tokyo (JP); Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/858,290

(22) Filed: Apr. 24, 2020

(65) Prior Publication Data

US 2021/0125904 A1 Apr. 29, 2021

(30) Foreign Application Priority Data

Oct. 23, 2019 (JP) .............................. JP2019-192904

(51) Int. Cl.
*H01L 23/495* (2006.01)
*H01L 23/31* (2006.01)
*H01L 23/36* (2006.01)
*H01L 23/00* (2006.01)

(52) U.S. Cl.
CPC .... *H01L 23/49575* (2013.01); *H01L 23/3107* (2013.01); *H01L 23/36* (2013.01); *H01L 23/49503* (2013.01); *H01L 23/49562* (2013.01); *H01L 24/48* (2013.01); *H01L 2224/48177* (2013.01)

(58) Field of Classification Search
CPC ........... H01L 23/49575; H01L 23/3107; H01L 23/49503; H01L 23/49562
See application file for complete search history.

(56) References Cited

U.S. PATENT DOCUMENTS

| | | | | |
|---|---|---|---|---|
| 2006/0056213 A1* | 3/2006 | Lee | ........................ | H01L 25/162 363/144 |
| 2009/0243078 A1* | 10/2009 | Lim | .................. | H01L 23/49575 257/690 |
| 2015/0028462 A1 | 1/2015 | Hasegawa et al. | | |
| 2016/0343644 A1* | 11/2016 | Kawashima | ...... | H01L 23/49575 |
| 2017/0294369 A1* | 10/2017 | Kawashima | ...... | H01L 23/49537 |
| 2018/0090423 A1* | 3/2018 | Shimizu | .................. | H01L 24/97 |
| 2019/0006258 A1* | 1/2019 | Muto | .................... | H01L 25/072 |

FOREIGN PATENT DOCUMENTS

JP 6024750 B2 11/2016

* cited by examiner

*Primary Examiner* — Marc Anthony Armand
(74) *Attorney, Agent, or Firm* — Studebaker & Brackett PC

(57) ABSTRACT

A semiconductor module includes: an insulating heat dissipation sheet; a semiconductor device provided on the heat dissipation sheet; a lead frame including a lead terminal and a die pad which are formed integrally; a wire connecting the lead frame to the semiconductor device and constituting a main current path; and a mold resin sealing the heat dissipation sheet, the semiconductor device, the lead frame and the wire, wherein the lead terminal is led out from the mold resin, the heat dissipation sheet is in direct contact with an undersurface of the die pad, and the wire is bonded to the die pad directly above a contact part provided between the die pad and the heat dissipation sheet.

11 Claims, 12 Drawing Sheets

SEMICONDUCTOR MODULE AND POWER CONVERSION APPARATUS

BACKGROUND OF THE INVENTION

Field

The present disclosure relates to a semiconductor module and a power conversion apparatus.

Background

In semiconductor modules, semiconductor devices and lead terminals are connected via wires. In recent years, "chip shrink" accompanying high performance of power semiconductor devices starting with SiC MOS chips is being achieved at an accelerating speed. Along with this, the number of wires is also restricted. As the number of wires decreases, the amount of heat generation of wires during module operation increases. This induces temperature rises in lead terminals and an outside printed circuit board connected thereto. Therefore, them is a problem that cooling cost for an end user increases.

As a technique for solving this problem, a configuration is being proposed in which a relay electrode is provided on a heat dissipation sheet and a wire and a lead terminal are connected to the relay electrode (e.g., see JP 6024750 (FIG. 1B)). This makes it possible to dissipate heat generated in the wire during module operation via the relay electrode and the heat dissipation sheet.

SUMMARY

However, adding the relay electrode causes the number of parts and the number of production steps to increase, which increases the production cost. Therefore, the conventional configuration has been difficult to apply to products that require mass production.

The present invention has been implemented to solve the above problem and it is an object of the present invention to provide a semiconductor module and a power conversion apparatus capable of improving heat dissipation and reducing manufacturing cost.

A semiconductor device according to the present disclosure includes: an insulating heat dissipation sheet; a semiconductor device provided on the heat dissipation sheet; a lead frame including a lead terminal and a die pad which are formed integrally; a wire connecting the lead frame to the semiconductor device and constituting a main current path; and a mold resin sealing the heat dissipation sheet, the semiconductor device, the lead frame and the wire, wherein the lead terminal is led out from the mold resin, the heat dissipation sheet is in direct contact with an undersurface of the die pad, and the wire is bonded to the die pad directly above a contact part provided between the die pad and the heat dissipation sheet.

In the present disclosure, the heat dissipation sheet is in direct contact with an undersurface of the die pad, and the wire is bonded to the die pad directly above a contact part provided between the die pad and the heat dissipation sheet. Thus, since heat generated in the wire during module operation is dissipated via the heat dissipation sheet, heat dissipation can be improved. Furthermore, there is no necessity to add new parts for heat dissipation of the wire. It is thereby possible to reduce the number of parts, the number of production steps, reduce manufacturing cost.

Other and further objects, features and advantages of the invention will appear more fully from the following description.

DESCRIPTION OF EMBODIMENTS

A semiconductor module and a power conversion apparatus according to the embodiments of the present disclosure will be described with reference to the drawings. The same components will be denoted by the same symbols, and the repeated description thereof may be omitted.

First Embodiment

Figure 1:
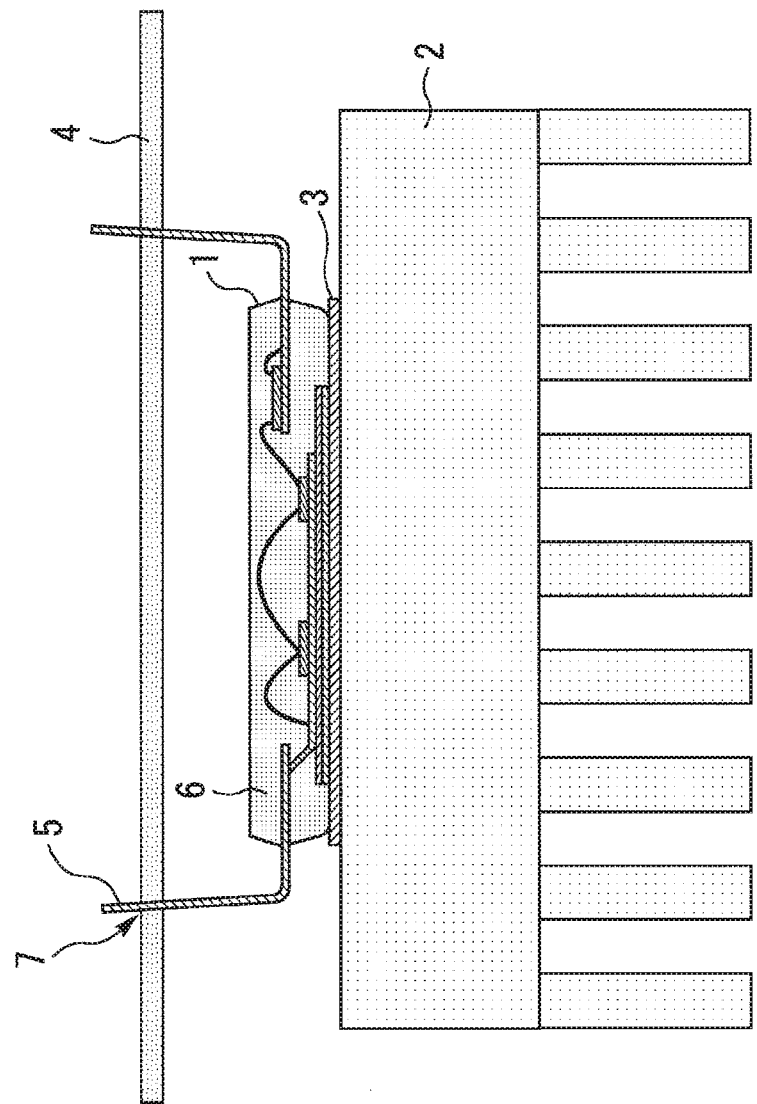
FIG. 1 is a cross-sectional view illustrating a state in which a semiconductor module according to a first embodiment is mounted.

FIG. 1 is a cross-sectional view illustrating a state in which a semiconductor module according to a first embodiment is mounted. A semiconductor module 1 is mounted above a heat sink 2 having a radiator fin via grease 3. A printed circuit board 4 is disposed above the semiconductor module 1. A lead terminal 5 of the semiconductor module 1 protrudes from mold resin 6, is inserted into a through hole 7 of the printed circuit board 4 and connected to a circuit of the printed circuit board 4.

Figure 2:
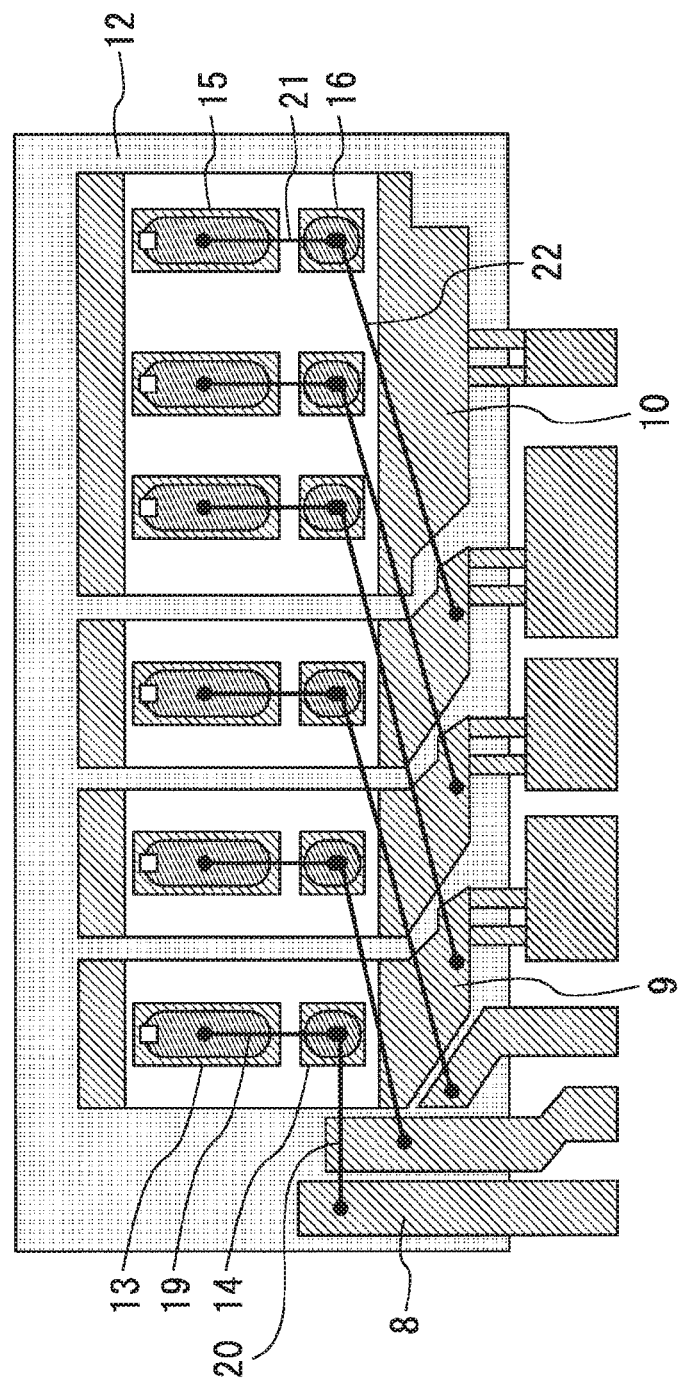
FIG. 2 is a plan view illustrating an internal configuration of the semiconductor module according to the first embodiment.
Figure 3:
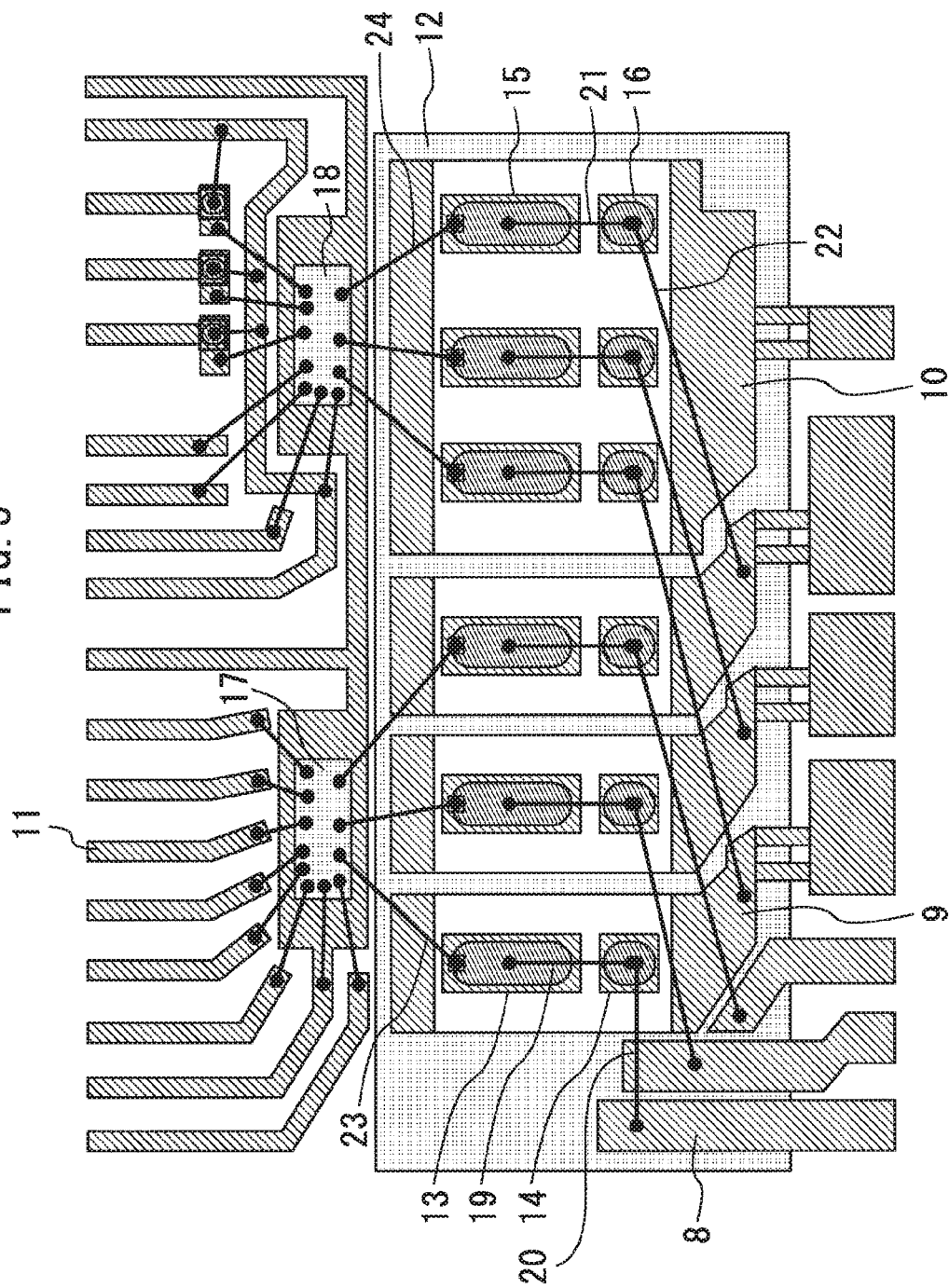
FIG. 3 is a partially enlarged plan view of FIG. 2.

FIG. 2 is a plan view illustrating an internal configuration of the semiconductor module according to the first embodiment. FIG. 3 is a partially enlarged plan view of FIG. 2. Three N-side lead frames 8, three output-side lead frames 9, one P-side lead frame 10 and control-side lead frames 11 are provided. These lead frames have been cut out from one metal plate and form a single lead frame connected to one another at a manufacturing stage. Therefore, the material and thickness of these lead frames are the same.

The N-side lead frames 8, the output-side lead frames 9 and the P-side lead frame 10 are provided on an insulating heat dissipation sheet 12. Three-phase N-side semiconductor devices 13 and 14 are die-bonded on the three output-side lead frames 9 respectively. Three-phase P-side semiconductor devices 15 and 16 are die-bonded on one P-side lead frame 10. For example, the N-side semiconductor devices 13 and the P-side semiconductor devices 15 are IGBTs and the N-side semiconductor devices 14 and the P-side semiconductor devices 16 are reflux diodes. The N-side semiconductor devices 15 are connected to low voltage sides of the P-side semiconductor devices 13. Control ICs 17 and 18 are connected to the control-side lead frames 11.

Top surface electrodes of the N-side semiconductor devices 13 and 14 are connected via wires 19 and undersurface electrodes are connected to the output-side lead frames 9. The top surface electrodes of the N-side semiconductor devices 14 are connected to the N-side lead frames 8 via wires 20. The top surface electrodes of the P-side semiconductor devices 15 and 16 are connected to each other via wires 21 and the undersurface electrodes are connected to the P-side lead frame 10. The top surface electrodes of the P-side semiconductor devices 16 are connected to the output-side lead frames 9 via wires 22. Control electrodes of the N-side semiconductor devices 13 are connected to the control IC 17 via wires 23. Control electrodes of the P-side semiconductor devices 15 are connected to the control IC 18 via wires 24.

Figure 4:
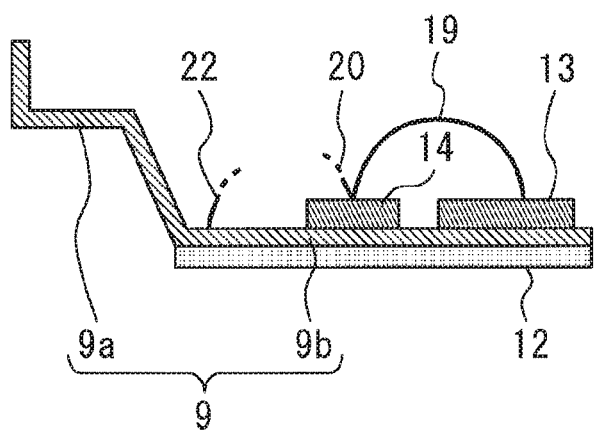
FIG. 4 is a cross-sectional view along the output-side lead frame in the internal configuration in FIG. 3.

FIG. 4 is a cross-sectional view along the output-side lead frame in the internal configuration in FIG. 3. The output-side lead frame 9 includes a lead terminal 9a and a die pad 9b, which are formed integrally. The heat dissipation sheet 12 is in direct contact with an undersurface of the die pad 9b. The wire 22 is bonded to the die pad 9b directly above a contact part provided between the die pad 9b and the heat dissipation sheet 12.

Figure 5:
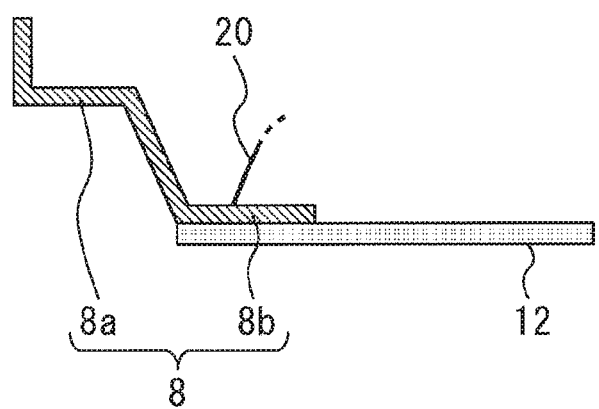
FIG. 5 is a cross-sectional view along the N-side lead frame in the internal configuration in FIG. 3.

FIG. 5 is a cross-sectional view along the N-side lead frame in the internal configuration in FIG. 3. The N-side lead frame 8 includes a lead terminal 8a and a die pad 8b, which are formed integrally. The heat dissipation sheet 12 is in direct contact with an undersurface of the die pad 8b. The wire 20 is bonded to the die pad 8b directly above a contact part provided between the die pad 8b and the heat dissipation sheet 12. The wires 20 and 22 constitute main current paths through which a large main current flows during module operation.

The mold resin 6 seals the heat dissipation sheet 12, the N-side semiconductor devices 13 and 14, the P-side semiconductor devices 15 and 16, the N-side lead frames 8, the output-side lead frames 9, the P-side lead frame 10, the control-side lead frames 11 and the wires 19 to 24. The lead terminals 8a of the N-side lead frames 8, the lead terminals 9a of the output-side lead frames 9, the lead terminal of the P-side lead frame 10 and the lead terminals of the control lead frames 11 are led out from the mold resin 6. The lead terminals 8a and 9a correspond to the lead terminal 5 in FIG. 1.

Figure 6:
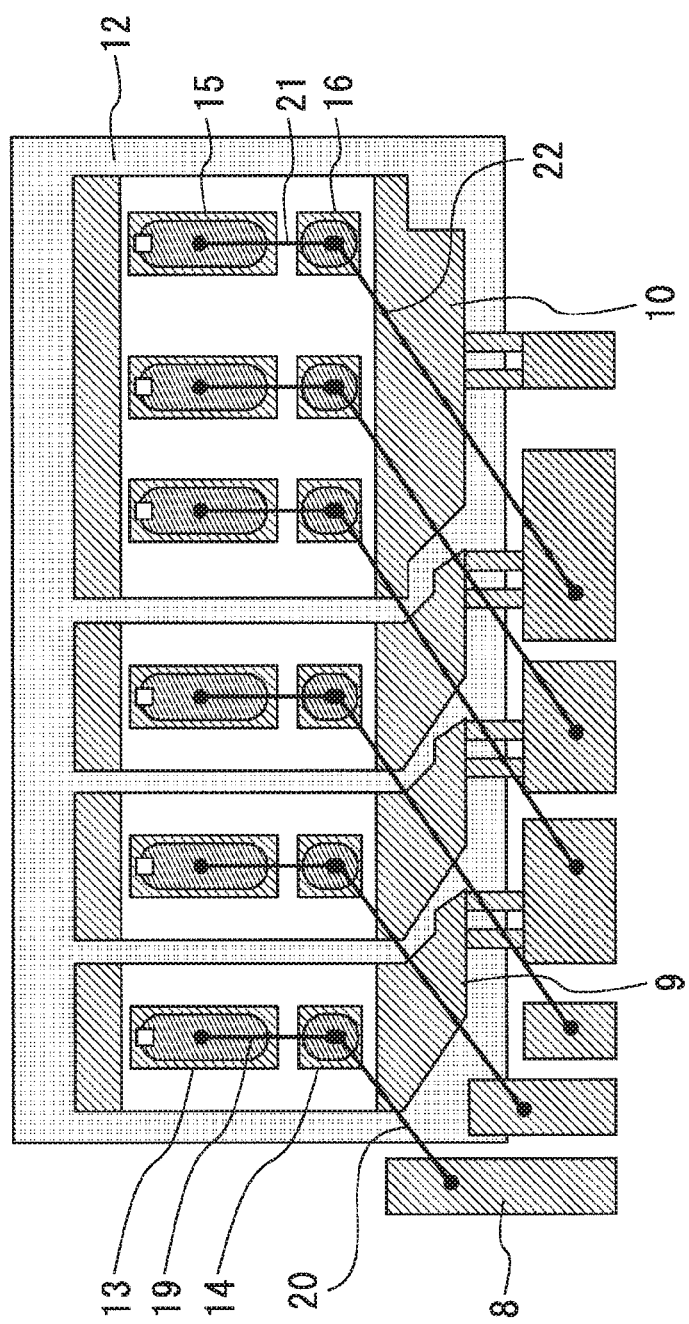
FIG. 6 is a partially enlarged plan view of an internal configuration of a semiconductor module according to a comparative example.
Figure 7:
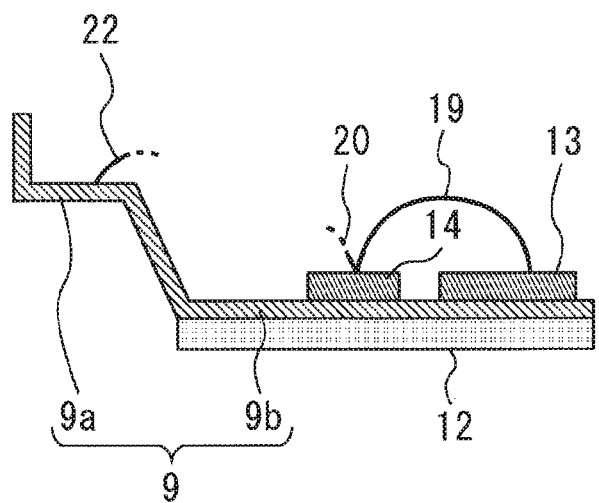
FIG. 7 is a cross-sectional view along an output-side lead frame in the internal configuration in FIG. 6.
Figure 8:
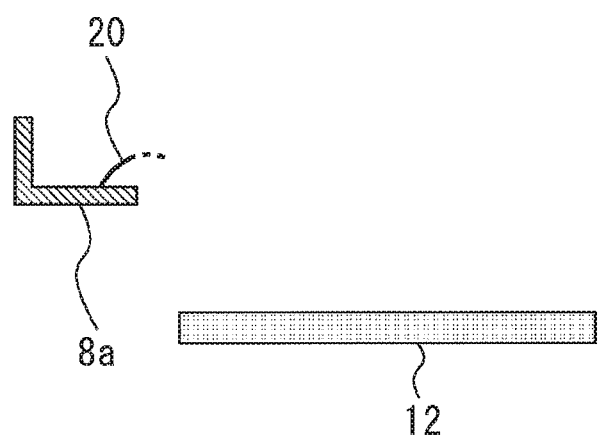
FIG. 8 is a cross-sectional view along an N-side lead frame in the internal configuration in FIG. 6.

Next, effects of the present embodiment will be described in comparison with comparative examples. FIG. 6 is a partially enlarged plan view of an internal configuration of a semiconductor module according to a comparative example. FIG. 7 is a cross-sectional view along an output-side lead frame in the internal configuration in FIG. 6. FIG. 8 is a cross-sectional view along an N-side lead frame in the internal configuration in FIG. 6. The output-side lead frame 9 connected to the P-side semiconductor device 16 via the wire 22 is also in close contact with the heat dissipation sheet 12 in the comparative example. However, the N-side lead frame 8 connected to the N-side semiconductor device 14 via the wire 20 is not in close contact with the heat dissipation sheet 12. The wire 20 is bonded to the lead terminal 8a of the N-side lead frame 8 not in contact with the heat dissipation sheet 12. The wire 22 is bonded to the lead terminal 9a of the output-side lead frame 9 not in contact with the heat dissipation sheet 12. Therefore, heat generated in the wires 20 and 22 during module operation cannot be dissipated through the heat dissipation sheet 12.

In contrast, in the present embodiment, the undersurface of the die pad 8b of the N-side lead frame 8 and the undersurface of the die pad 9b of the output-side lead frame 9 are in direct contact with the heat dissipation sheet 12 without any adhesive or the like on the same plane. The die pads 8b and 9b, and the heat dissipation sheet 12 are brought into close contact by being sealed with the mold resin 6. The wire 20, which becomes a main current path, is bonded to the die pad 8b directly above the contact part provided between the die pad 8b of the N-side lead frame 8 and the heat dissipation sheet 12. The wire 22, which becomes a main current path, is bonded to the die pad 9b directly above the contact part between the die pad 9b of the output-side lead frame 9 and the heat dissipation sheet 12.

Thus, since heat generated in the wires 20 and 22 during module operation is dissipated to the heat sink 2 via the heat dissipation sheet 12, heat dissipation can be improved. Therefore, it is possible to suppress heat transmission to the lead terminals 8a and 9a, suppress temperature rises in the lead terminals 8a and 9a and the outside printed circuit board 4 after mounting, and suppress cooling cost of the system.

Furthermore, the above configuration is applicable to a mold type semiconductor module using a single lead frame, and there is no necessity to add new parts for heat dissipation of the wires 20 and 22. It is thereby possible to reduce the number of parts, the number of production steps, reduce manufacturing cost, and the embodiment is therefore applicable to products requiring mass production.

The N-side lead frame 8 has a height difference between the lead terminal 8a and the die pad 8b. This allows the heat dissipation sheet 12 and a heat dissipation plate (not shown) provided therebelow to be made thinner, which can improve thermal resistance of the module. The same applies to the configuration of the output-side lead frame 9.

Figure 9:
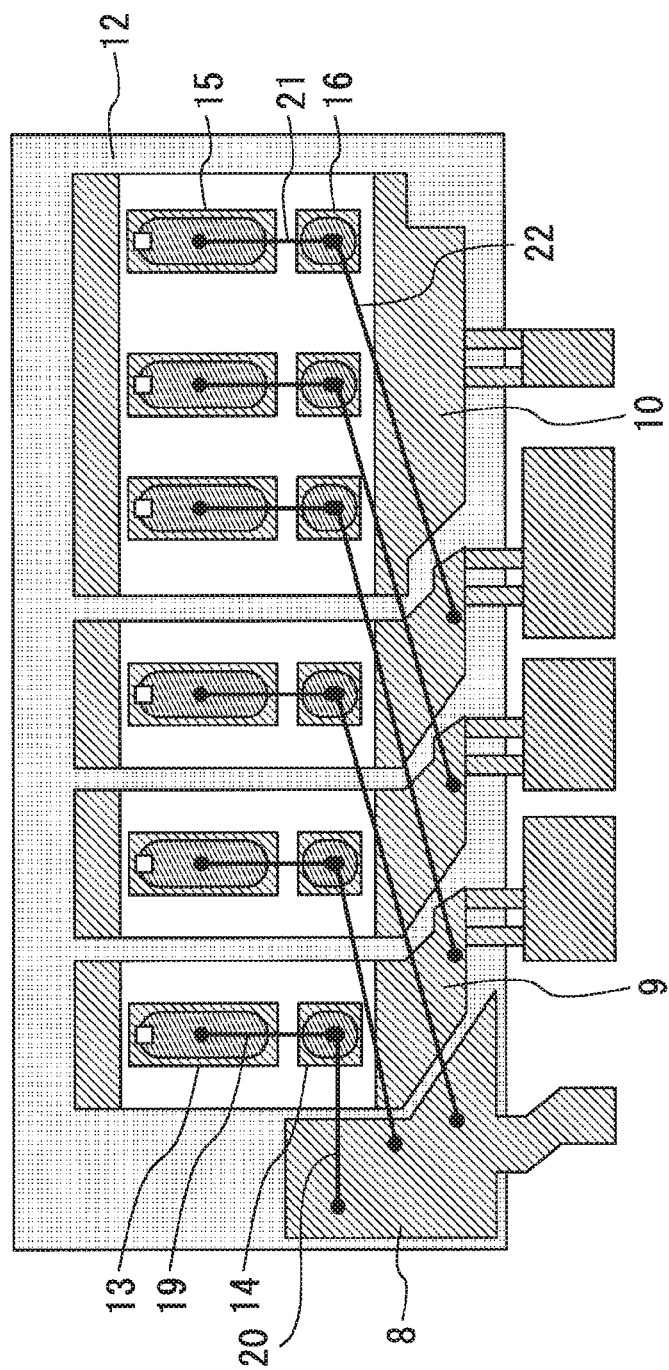
FIG. 9 is a partially enlarged plan view of an internal configuration of a modification of the semiconductor module according to the first embodiment.

FIG. 9 is a partially enlarged plan view of an internal configuration of a modification of the semiconductor module according to the first embodiment. FIG. 3 shows a three-shunt configuration in which three N-side lead frames 8 are respectively connected to the three-phase semiconductor devices 14 via the wires 20. In contrast, FIG. 9 shows a one-shunt configuration in which one N-side lead frame 8 is connected to the three-phase semiconductor devices 14 via the wires 20 respectively. The N-side lead frames for three phases are combined, the area of the N-side lead frames 8 thereby increases, radiation capacity improves, and temperature rises of the lead terminal 8a of the N-side lead frame 8 can thereby be suppressed.

Second Embodiment

Figure 10:
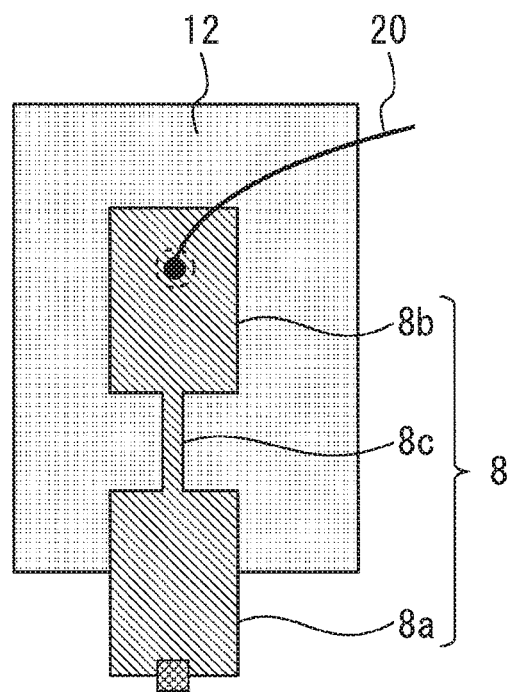
FIG. 10 is a cross-sectional view illustrating a semiconductor module according to a second embodiment.

FIG. 10 is a cross-sectional view illustrating a semiconductor module according to a second embodiment. The N-side lead frame 8 includes a joining part 8c provided between the lead terminal 8a and the die pad 8b and having a smaller cross-sectional area than those of the lead terminal 8a and the die pad 8b. This causes thermal resistance between the die pad 8b to which the wire 20 is bonded and the lead terminal 8a to increase, and can thereby further suppress heat transmission to the lead terminal 8a side. Note that the joining part 8c may have a linear shape or bent shape. Similar effects can also be obtained even when a joining part is provided in the output-side lead frame 9.

Third Embodiment

Figure 11:
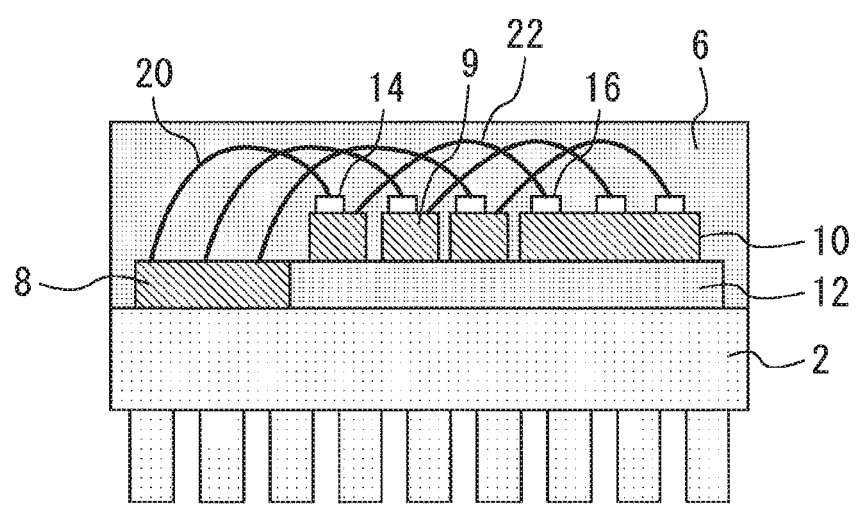
FIG. 11 is a cross-sectional view illustrating a semiconductor module according to a third embodiment.

FIG. 11 is a cross-sectional view illustrating a semiconductor module according to a third embodiment. The heat dissipation sheet 12 is in close contact with the undersurfaces of the output-side lead frame 9 and the P-side lead frame 10. On the other hand, the undersurface of the N-side lead frame 8 is not covered with the heat dissipation sheet 12. The undersurface of the heat dissipation sheet 12 and the undersurface of the N-side lead frame 8 are exposed from the mold resin 6 and are flush with each other. During module mounting, the exposed undersurfaces of the heat dissipation sheet 12 and the N-side lead frame 8 are in close contact with the heat sink 2. Here, in the configuration of the first embodiment, it is necessary to expand the area of the heat dissipation sheet 12 rather than the area in the comparative example. In contrast, in the present embodiment, since the required area of the heat dissipation sheet 12 can be made smaller than that in the first embodiment, manufacturing cost can thereby be reduced.

Figure 12:
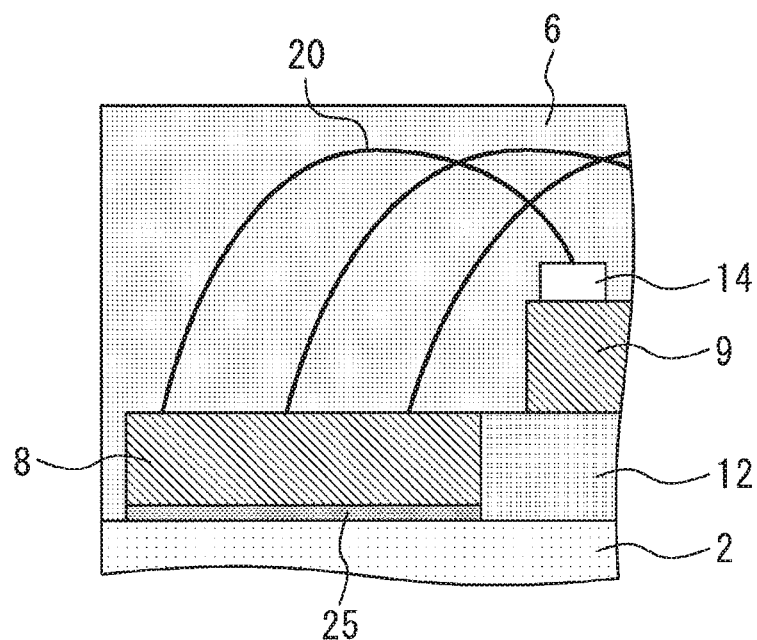
FIG. 12 is a cross-sectional view illustrating a modification of the semiconductor module according to the third embodiment.

FIG. 12 is a cross-sectional view illustrating a modification of the semiconductor module according to the third embodiment. An insulating member 25 is applied to the undersurface of the N-side lead frame 8. Note that the insulating member 25 is preferably made of silicone grease or the like having excellent heat-resistance and resistance to cold. When the semiconductor module 1 is mounted on the heat sink 2, since the insulating member 25 is located between the N-side lead frame 8 and the heat sink 2, insulation of both parts can be secured. Therefore, the present modification is also applicable to applications requiring insulation between the inside and the outside of the module.

Fourth Embodiment

Figure 13:
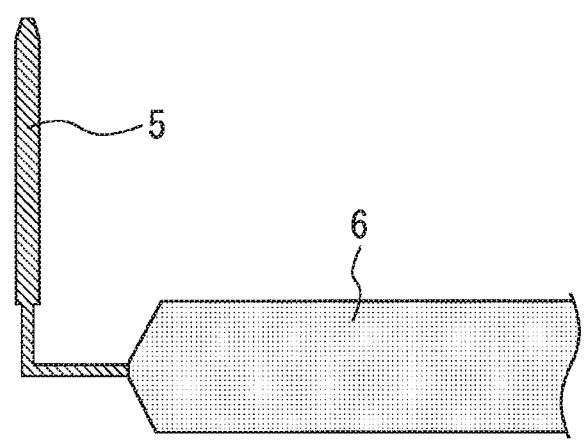
FIG. 13 is a cross-sectional view illustrating a semiconductor module according to a fourth embodiment.

FIG. 13 is a cross-sectional view illustrating a semiconductor module according to a fourth embodiment. A distal end part of the lead terminal 5 led out from the mold resin 6 is thicker than the root of the lead terminal 5.

The distal end part of the lead terminal 5 is inserted into through hole 7 of the printed circuit board 4 during system mounting and fixed by soldering. During module operation, heat generated in the lead terminal 5 is transmitted to the printed circuit board 4. In contrast, in the present embodiment, the volume of the lead terminal 5 increases and heat dissipation capacity improves, and it is thereby also possible to suppress temperature rises in the lead terminal 5 and the printed circuit board 4.

Figure 14:
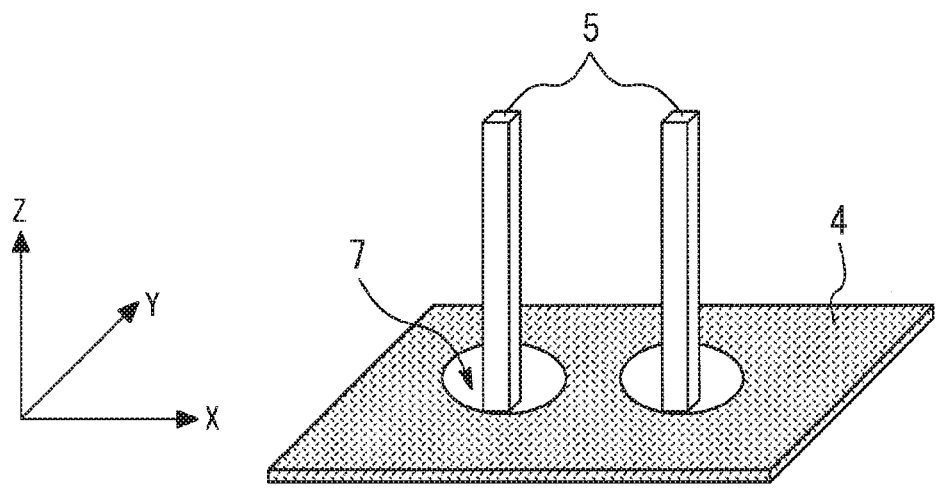
FIG. 14 is a perspective view illustrating a state in which distal end parts of the lead terminal are inserted into through holes of the printed circuit board.
Figure 15:
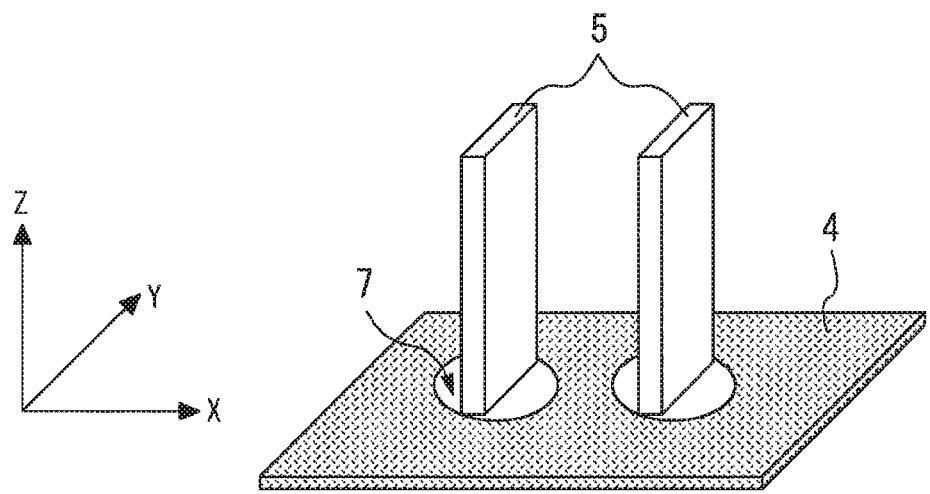
FIG. 15 is a perspective view illustrating a state in which distal end parts of the lead terminal are inserted into through holes of the printed circuit board.
Figure 16:
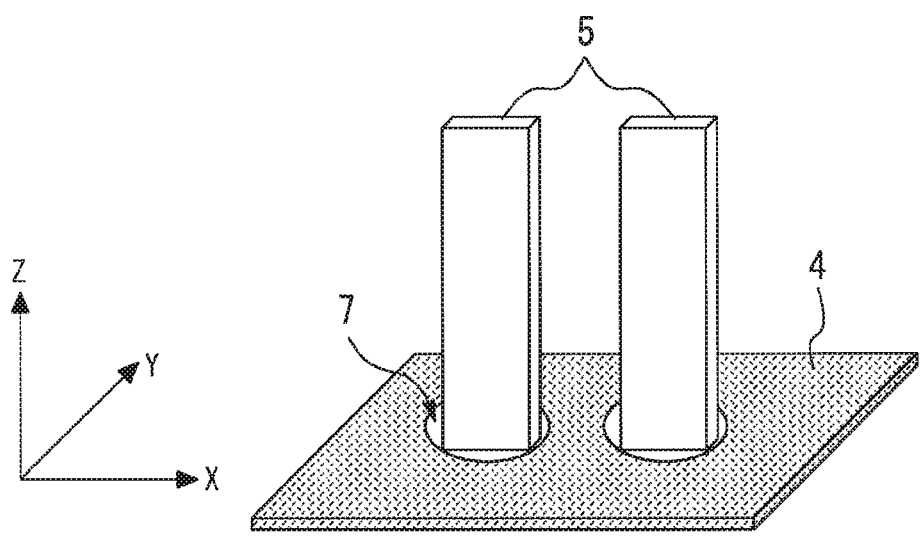
FIG. 16 is a perspective view illustrating a state in which distal end parts of the lead terminal are inserted into through holes of the printed circuit board.

FIG. 14 to FIG. 16 are perspective views illustrating a state in which distal end parts of the lead terminal are inserted into through holes of the printed circuit board. A plurality of lead terminals 5 are arranged in the X direction. In FIG. 14, the thickness of the distal end part of the lead terminal 5 is not large. The thickness of the lead terminal 5 can be increased in both X and Y directions. However, if the thickness of the lead terminal 5 in the X direction is increased as shown in FIG. 16, the pitch between the lead terminals 5 is reduced, which may cause insulation fault. Therefore, the thickness is preferably increased in the Y direction as shown in FIG. 15.

Fifth Embodiment

Figure 17:
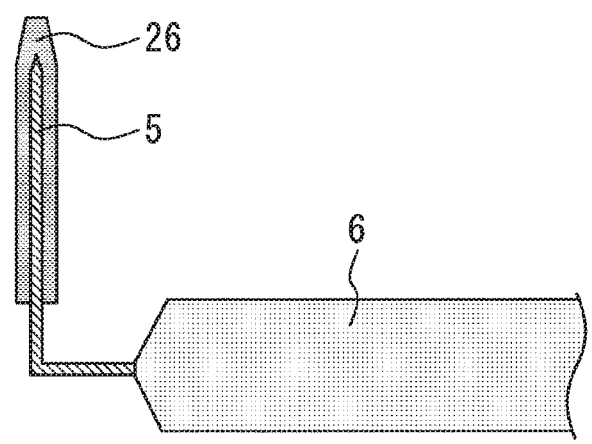
FIG. 17 is a cross-sectional view illustrating a semiconductor module according to a fifth embodiment.

FIG. 17 is a cross-sectional view illustrating a semiconductor module according to a fifth embodiment. A metallic attachment 26 is joined to the distal end part of the lead terminal 5 led out from the mold resin 6. Effects similar to those of the fourth embodiment can also be obtained by attaching the external attachment 26 to the lead terminal 5 and increasing the thickness of the terminal. The attachment 26 is formed of various metal raw materials to secure conductivity between the lead terminal 5 and the printed circuit board 4.

The semiconductor devices 13-16 are not limited to devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Sixth Embodiment

In this embodiment, the semiconductor modules according to the first to fifth embodiments described above are applied to an electric power conversion device. Although the present disclosure is not limited to a specific electric power conversion device, a case where the present disclosure is applied to a three-phase inverter as the sixth embodiment will be described below.

Figure 18:
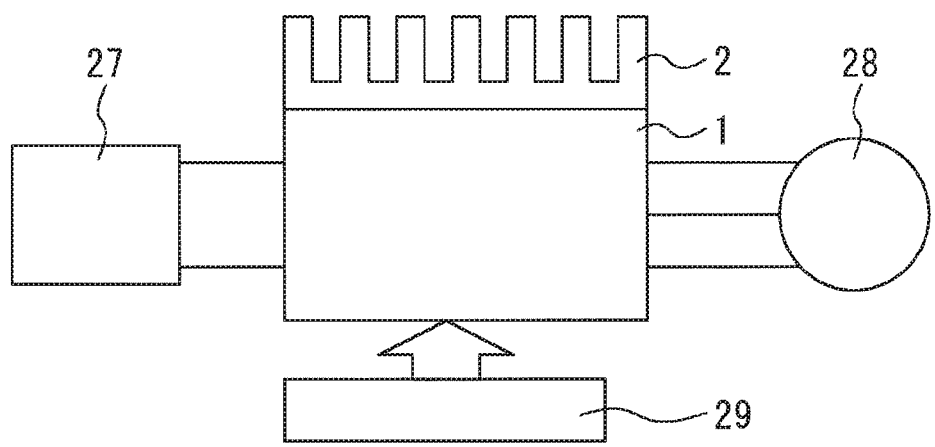
FIG. 18 is a block diagram illustrating an electric power conversion device according to the sixth embodiment is applied.

FIG. 18 is a block diagram illustrating an electric power conversion device according to the sixth embodiment is applied. This electric power conversion system includes a power supply 27, a semiconductor module 1, a inductive load 28, a control circuit 29, and a heatsink 2. The control circuit 29 corresponds to the printed circuit board 4 in FIG. 1. The power supply 27 is a DC power supply and supplies DC power to the semiconductor module 1. The power supply 27 can be composed of various components. For example, the power supply 27 can be composed of a DC system, a solar cell, or a storage battery, or may be composed of a rectifier or an AC/DC converter, which is connected to an AC system. Alternatively, the power supply 27 may be composed of a DC/DC converter that convers DC power output from a DC system to predetermined power.

The semiconductor module 1 is a three-phase inverter connected between the power supply 27 and the inductive load 28, converts DC power supplied from the power supply 27 into AC power, and supplies the AC power to the inductive load 28.

The inductive load 28 is a three-phase electric motor that is driven by AC power supplied from the semiconductor module 1. The inductive load 28 is not limited to a specific application. The load is used as an electric motor mounted on various electric devices, such as an electric motor for, for example, a hybrid vehicle, an electric vehicle, a railroad vehicle, an elevator, or an air-conditioner.

The semiconductor module 1 will be described in detail below. The semiconductor module 1 is a main conversion circuit which includes a switching device and a reflux diode (not illustrated). When the switching device is switched, the semiconductor module 1 converts DC power supplied from the power supply 27 into AC power, and supplies the AC power to the inductive load 28. The semiconductor module 1 may have various types of specific circuit configurations. The semiconductor module 1 according to this embodiment is a two-level three-phase full-bridge circuit, which can be composed of six switching devices and six reflux diodes connected in antiparallel with the respective switching devices. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the semiconductor module 1, are connected to the inductive load 28. The semiconductor module 1 is composed of a semiconductor module corresponding to any one of the first to fifth embodiments described above.

The control IC built in the semiconductor module 1 generates a drive signal for driving a switching device also built in the semiconductor module 1. Specifically, the control IC outputs, to the control electrode of each switching device, a drive signal for turning on each switching device and a drive signal for turning off each switching device, according to the control signal output from the control circuit 29, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 29 controls each switching device of the semiconductor module 1 so as to supply a desired power to the inductive load 28. Specifically, the control circuit 29 calculates a period (ON period), in which each switching device of the semiconductor module 1 is in the ON state, based on the power to be supplied to the inductive load 28. For example, the semiconductor module 1 can be controlled by a PWM control for modulating the ON period of each switching device depending on the voltage to be output. Further, the control circuit 29 outputs a control command (control signal) to the control IC included in the semiconductor module 1 so that the ON signal is output to each switching device to be turned on and an OFF signal is output to each switching device to be turned off at each point. The control IC outputs the ON signal or OFF signal, as the drive signal, to the control electrode of each switching device according to the control signal.

The heat sink 2 releases heat generated by driving the semiconductor module 1 to the outside. Specifically, bonding grease is applied between the heat sink 2 and the semiconductor module 1, and the heat generated by the semiconductor module 1 is released to the outside by utilizing the heat conduction of the heat sink 2 and the bonding grease. The heat sink 2 may be attached to only one side of the semiconductor module 1 or may be attached to both sides.

In the electric power conversion device according to this embodiment, the semiconductor modules according to the first to fifth embodiments are applied. Accordingly, the size and cost of the electric power converter can be reduced, and the reliability can be improved.

While this embodiment illustrates an example in which the present disclosure is applied to a two-level three-phase inverter, the present disclosure is not limited to this and can be applied to various electric power conversion devices. While this embodiment illustrates a two-level electric power conversion device, the present disclosure can also be applied to a three-level or multi-level electric power conversion device. When power is supplied to a single-phase load, the present disclosure may be applied to a single-phase inverter. The present disclosure can also be applied to a DC/DC converter or an AC/DC converter when power is supplied to a DC load or the like.

Further, in the electric power conversion device to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2019-192904, filed on Oct. 23, 2019 including specification, claims, drawings and summary, on which the convention priority of the present application is based, is incorporated herein by reference in its entirety.

The invention claimed is:

1. A semiconductor module comprising:
   an insulating heat dissipation sheet;
   a first semiconductor device provided on the heat dissipation sheet;
   a second semiconductor device provided on the heat dissipation sheet and directly connected to the first semiconductor device;
   a third semiconductor device directly connected to the second semiconductor device;
   a lead frame including a lead terminal and a die pad which are formed integrally;
   a wire connecting the lead frame to the first semiconductor device and constituting a main current path; and
   a mold resin sealing the heat dissipation sheet, the first semiconductor device, the lead frame and the wire,
   wherein the lead terminal is led out from the mold resin,
   the heat dissipation sheet is in direct contact with an undersurface of the die pad, the wire is bonded to the die pad directly above a contact part provided between the die pad and the heat dissipation sheet, and the lead frame has a height difference between a portion of the lead terminal sealed by the mold resin and the die pad.

2. The semiconductor module according to claim 1, wherein the second semiconductor device is a low voltage side semiconductor device and the first semiconductor device is a high voltage side semiconductor device connected to a high voltage side of the low voltage side semiconductor device.

3. The semiconductor module according to claim 1, wherein the lead frame includes a joining part provided between the lead terminal and the die pad and having a smaller cross-sectional area than those of the lead terminal and the die pad.

4. The semiconductor module according to claim 1, wherein the second semiconductor device is a low voltage side semiconductor device connected to a low voltage side of the first semiconductor device, the semiconductor module further comprises a low side lead frame connected via a wire to the low voltage side semiconductor device, and an undersurface of the low side lead frame is not covered with the heat dissipation sheet and is exposed from the mold resin.

5. The semiconductor module according to claim 4, further comprising an insulating member applied to the undersurface of the low side lead frame.

6. The semiconductor module according to claim 1, wherein the second semiconductor device includes three-phase semiconductor devices, and one lead frame is connected to the three-phase semiconductor devices via wires respectively.

7. The semiconductor module according to claim 1, wherein a distal end part of the lead terminal led out from the mold resin is thicker than a root of the lead terminal.

8. The semiconductor module according to claim 1, further comprising a metallic attachment joined to a distal end part of the lead terminal led out from the mold resin.

9. The semiconductor module according to claim 1, wherein the first semiconductor device is made of a wide-band-gap semiconductor.

10. A power conversion apparatus comprising:

the semiconductor module according to claim 1 converting input power and outputting converted power;

a control circuit outputting a control signal for controlling the semiconductor module to the semiconductor module; and a heat sink dissipating heat of the semiconductor module.

11. The semiconductor module according to claim 1, further comprising:

a first die pad on the heat dissipation sheet, wherein the die pad is a second die pad, the first semiconductor device is provided on the first die pad, the lead terminal and the second die pad are separated from the first die pad, and the mold resin seals the first die pad.

* * * * *